US007126873B2

(12) United States Patent
See et al.

(10) Patent No.: US 7,126,873 B2
(45) Date of Patent: Oct. 24, 2006

(54) METHOD AND SYSTEM FOR EXPANDING FLASH STORAGE DEVICE CAPACITY

(75) Inventors: Sun-Teck See, San Jose, CA (US);
Horng-Yee Chou, Palo Alto, CA (US);
Charles C. Lee, Sunnyvale, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 179 days.

(21) Appl. No.: 10/882,005

(22) Filed: Jun. 29, 2004

(65) Prior Publication Data

US 2005/0286284 A1    Dec. 29, 2005

(51) Int. Cl.
*G11C 8/00*      (2006.01)
*G11C 7/10*      (2006.01)
*G11C 16/04*     (2006.01)
*G06F 12/02*     (2006.01)
*G06F 12/06*     (2006.01)

(52) U.S. Cl. .................. 365/230.06; 365/63; 365/191; 365/185.11; 365/230.03; 711/2; 711/5; 711/211

(58) Field of Classification Search ........... 365/189.02, 365/230.02, 230.03; 711/211
See application file for complete search history.

(56) References Cited

U.S. PATENT DOCUMENTS

| | | | | |
|---|---|---|---|---|
| 4,788,642 A | * | 11/1988 | Suzuki et al. | 710/119 |
| 5,338,981 A | * | 8/1994 | Kim et al. | 326/105 |
| 5,732,245 A | * | 3/1998 | Lee et al. | 711/163 |
| 5,740,404 A | * | 4/1998 | Baji | 711/167 |
| 5,822,251 A | * | 10/1998 | Bruce et al. | 365/185.33 |
| 6,199,151 B1 | * | 3/2001 | Williams et al. | 711/203 |
| 6,226,730 B1 | * | 5/2001 | Murdoch et al. | 711/203 |
| 2004/0168014 A1 | * | 8/2004 | Lofgren et al. | 711/103 |

FOREIGN PATENT DOCUMENTS

JP          07175783 A    *    7/1995

* cited by examiner

*Primary Examiner*—Amir Zarabian
*Assistant Examiner*—Ly Duy Pham
(74) *Attorney, Agent, or Firm*—Sawyer Law Group LLP

(57) ABSTRACT

Through the use of an allocation logic unit with a Flash controller, a single primary chip enable is de-multiplexed into a multiple secondary chip enables for multiple Flash memory dies or chips. In so doing, Flash storage device capacity is greatly expanded. In a first aspect, a memory package includes a plurality of memories; and an allocation logic unit coupled to the plurality of memories for receiving a single chip enable signal. The allocation logic unit de-multiplexes the single chip enable signal to a plurality of chip enable signals. Each of the plurality of chip enable signals access to one of the plurality of memories.

In a second aspect, a printed circuit board (PCB) includes a Flash controller for providing at least one primary chip enable signal. The PCB also includes a plurality of Flash memory chips and at least one allocation logic unit coupled to at least a portion of the plurality of Flash memory chips and the Flash controller. The allocation logic unit receives the at least one chip enable signal and de-multiplexes the at least one chip enable signal to a plurality of secondary chip enable signals. Each of the plurality of chip enable signals controls access to one of the Flash memory chips.

9 Claims, 4 Drawing Sheets

Allocation Logic - Four Flash Memories

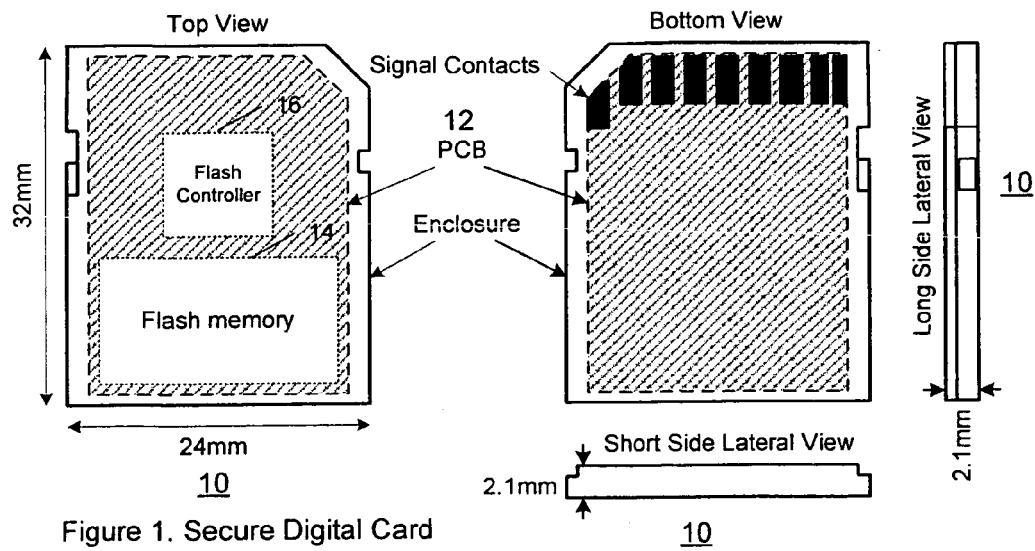
Figure 1. Secure Digital Card
PRIOR ART
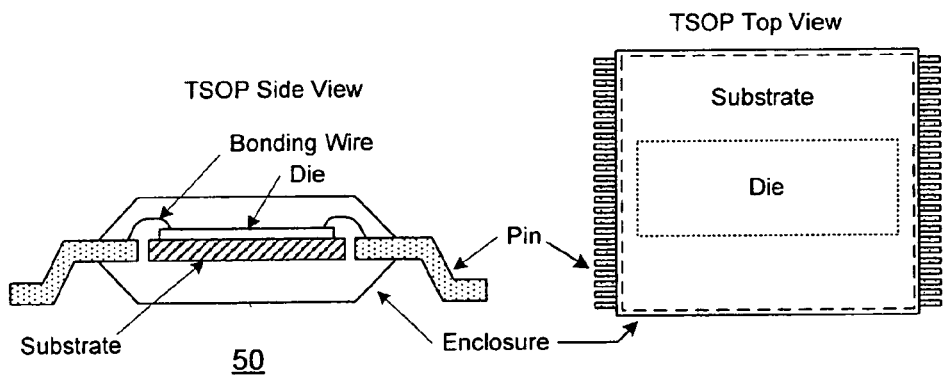
Figure 2. A Flash Memory Chip in TSOP Package
PRIOR ART
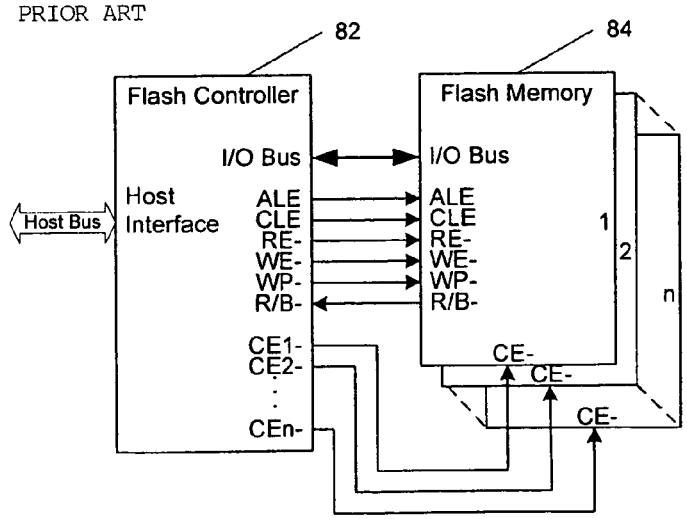
Fig. 3. A typical block diagram inside a Flash storage device
PRIOR ART

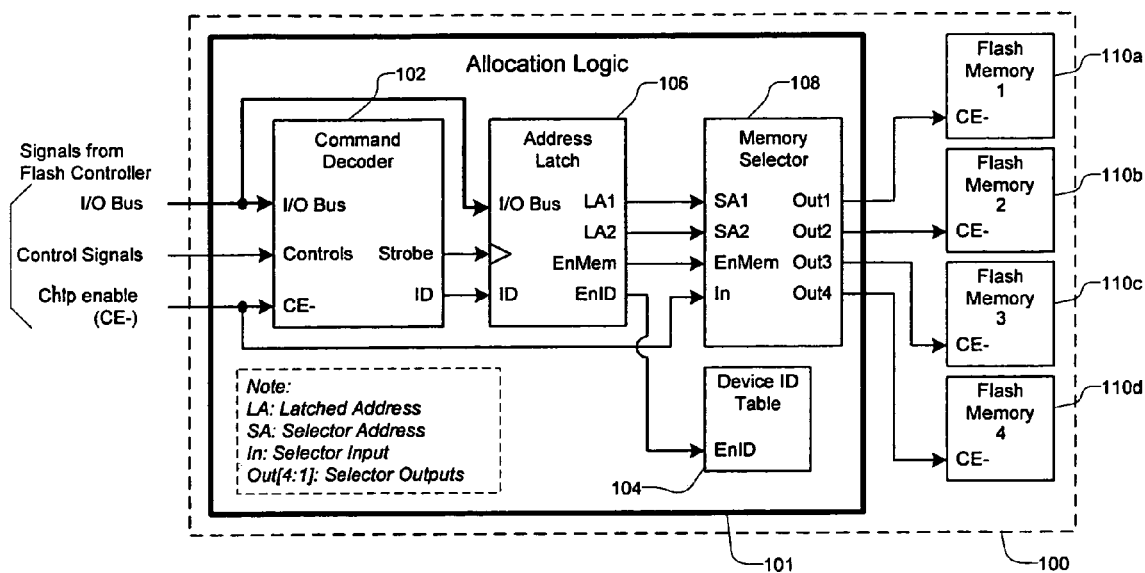
Figure 4A. Allocation Logic - Four Flash Memories

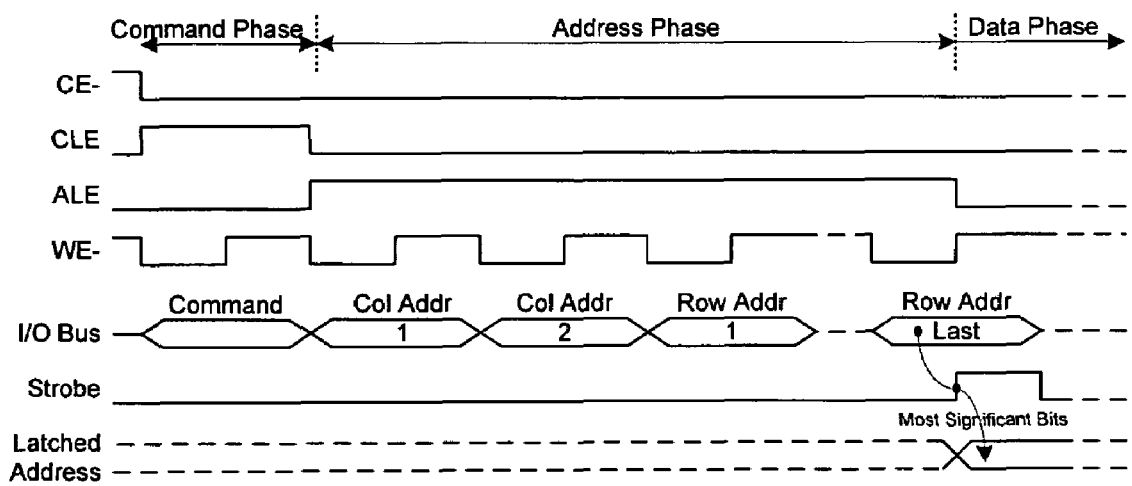
Figure 4B. Flash Memory Normal Access Cycle Diagram

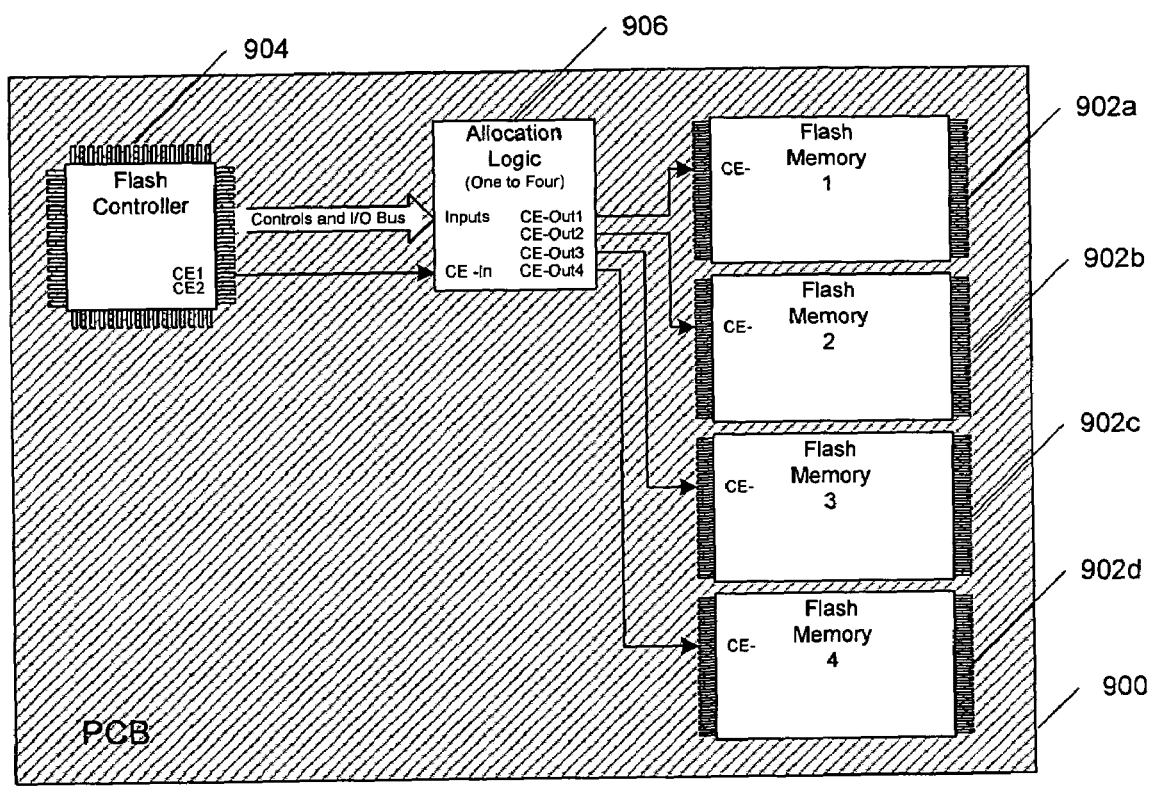
Figure 5. Four Flash Memory Chips Sharing Single Chip Enable

METHOD AND SYSTEM FOR EXPANDING FLASH STORAGE DEVICE CAPACITY

FIELD OF THE INVENTION

The present invention relates generally to memories and more particularly to a system and method for expanding the capacity of Flash storage devices.

BACKGROUND OF THE INVENTION

The nature of non-volatile, vibration-free, small size and low power consumption has made the Flash memory an excellent component to be utilized in various Flash storage devices. Flash storage devices are widely used as memory storage for computer and consumer system products such as notebook, desktop computer, set top box, digital camera, mobile phone, PDA and GPS etc. The increasing demand for more storage in these products has driven the need to expand the capacity of the Flash storage devices.

There are two types of Flash storage devices. The first type has a pre-defined mechanical dimension. This type includes: (a) Secure Digital (SD) card, (b) Multi Media Card (MMC), (c) Memory Stick (MS) card, (d) Compact Flash (CF) card, (e) Express Flash card, (f) Serial ATA Flash disk, (g) IDE Flash disk, (h) SCSI Flash disk, etc.

The second type of Flash storage devices has no pre-defined physical dimension, which includes USB Flash disk, Disk On Module (DOM), MP3 player etc. However, corresponding based upon the need for the system compactness, it is generally desirable to make this type of Flash storage device as small in size and as high in capacity as possible.

Space constraints and available Flash memory density are the major obstacles in expanding the capacity of the Flash storage devices. FIG. 1 illustrates top, bottom, short side lateral and long side lateral views of a secure digital (SD) card 10. The SD card 10 is defined with a form factor of 32×24×2.1 mm (length×width×thick). This fixed dimension restricts the number of components populated on a printed circuit board (PCB) 12. For instance, if TSOP type of Flash memory is used, only a Flash memory chip 14 and a Flash controller 16 can be placed in the space constraint. The available Flash memory density further limits the overall SD card capacity. For instance, if the highest Flash memory is 4 Gb, the maximum SD card capacity is then limited to 512 MB.

A Flash memory die is the basic element of Flash memory. A typical Flash memory chip comprises a Flash memory die mounted on a substrate within an enclosure and the electrical signals are bonded out to the metal contacts of the package. FIG. 2 illustrates a Flash memory chip 50 in a thin, small out-line package (TSOP). The popular package types for flash memory chip are TSOP (Thin Small Out-line Package), WSOP (Very Very Thin Small Out-line Package) and BGA (Ball Grid Array) etc. For the purposes of this application, Flash memory will be used to describe both a Flash memory die and a Flash memory chip.

Besides power and ground, a flash memory includes the following electrical signals:

(a) Bidirectional signals: I/O (Input/Output) bus. It is a bidirectional bus. Flash memory uses this bus to input command, address and data, and to output data during read operation. Multiple Flash memories can share this bus with a Flash controller.

(b) Common Input Control Signals: ALE (Address Latch Enable), CLE (Command Latch Enable), RE- (Read Enable), WE- (Write Enable), WP- (Write Protect). Driven by Flash controller for various operations to Flash memory. These signals are shared among multiple Flash memories connected to a single I/O bus.

(c) Exclusive Input Control Signal: CE- (Chip Enable). Driven by Flash memory controller to enable the Flash memory for access. To ensure only one of them is enabled at a time, each Flash memory is connected to a unique CE-.

(d) Output Status Signals: R/B- (Ready/Busy-). Driven by Flash memory when it is busy, not ready to accept command from the Flash controller. It is an open-drain signal that can be shared among multiple Flash memories connecting to a single I/O bus.

The typical functional block diagram of a Flash storage device 80 is shown in FIG. 3. It comprises a Flash controller 82 and at least a Flash memory 84. One end of the Flash controller 82 interfaces to the host while the other end controls the access to Flash memory 84.

In many instances, due to cost and pin count considerations, a Flash controller has a limited number of chip enable signals. This limitation imposes a restriction on capacity expansion.

Furthermore, as the demand for Flash storage devices has increased, a shortage of certain types of Flash memory occurs during the course of a year. Flash types of the most popular density are typically out of supply during the peak seasons.

Accordingly it is desirable to provide ways to expand the capacity of Flash storage devices. The present invention addresses such a need.

SUMMARY OF THE INVENTION

Through the use of an allocation logic unit with a Flash controller, a single primary chip enable from an input pin is de-multiplexed into a multiple secondary chip enables for multiple Flash memory dies or chips. In so doing, Flash storage device capacity is greatly expanded.

In a first aspect, a memory package includes a plurality of memories; and an allocation logic unit coupled to the plurality of memories for receiving a single chip enable signal. The allocation logic unit de-multiplexes the single chip enable signal to a plurality of chip enable signals. Each of the plurality of chip enable signals access to one of the plurality of memories.

In a second aspect, a printed circuit board (PCB) includes a Flash controller for providing at least one primary chip enable signal. The PCB also includes a plurality of Flash memory chips and at least one allocation logic unit coupled to at least a portion of the plurality of Flash memory chips and the Flash controller. The allocation logic unit receives the at least one chip enable signal and de-multiplexes the at least one chip enable signal to a plurality of secondary chip enable signals. Each of the plurality of chip enable signals controls access to one of the Flash memory chips.

BRIEF DESCRIPTION OF THE FIGURES

FIG. 1 illustrates a top and bottom view of a secure digital card.

FIG. 2 illustrates a Flash memory chip in a thin, small out-line package (TSOP).

FIG. 3 illustrates a block diagram inside a conventional Flash storage device.

FIG. 4A illustrates an allocation logic unit for a group of four Flash memories.

FIG. 4B illustrates a Flash memory normal access cycle diagram with the present invention.

FIG. 5 illustrates a printed circuit board including Flash memory chips in accordance with the present invention.

DETAILED DESCRIPTION

The present invention relates generally to memories and more particularly to a system and method for expanding the capacity of Flash storage devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

As before mentioned, a Flash controller has a limited number of chip enables. This limitation imposes a restriction on the capacity expansion of Flash storage devices. A system and method in accordance with the present invention allows for multiple Flash memories to be utilized with a single chip enable. This is accomplished by multiple Flash memory dies utilizing a single chip enable and multiple Flash memory chips utilizes a single chip enable. To describe the features of the present invitation in more detail, refer now to the following description in conjunction with the accompanying figures.

1. Multiple-Die in Single Package with Single Chip Enable

For multiple dies in a single package, the present invention provides an allocation logic unit to increase the density of the Flash memory chip within a package when a limited number of chip enables are available. The allocation logic unit de-multiplexes a single external chip enable from an input pin to the multiple internal chip enables for each of the dies. The allocation logic unit is connected to the plurality of Flash memory dies typically of the same type such that at any time only one of the dies will be enabled.

FIG. 4A illustrates a Flash memory chip 100 in accordance with the present invention. In this embodiment there are four Flash memories 110a–110d that are part of the package. One of ordinary skill in the art readily recognizes that although in this embodiment, four Flash memory dies are shown in this embodiment, any number of Flash dies could be utilized and they would be within the spirit and scope of the present invention.

The allocation logic unit 101 comprises a command decoder 102, a device ID table 104, an address latch 106 and a memory selector 108. From the control signals and I/O bus, the command decoder 102 decodes the type of operations.

The device ID table 104, comprising a group of registers, is enabled during ID read access operation to provide device information of the group of Flash memory dies 110a–110d. During the normal access operation, the address latch 106 stores the highest block address bits from the I/O bus as the latched address, with which the memory selector 108 selects one of the Flash memory dies 110a–110d to connect to the chip enable from the Flash controller for normal data access.

A Flash memory is typically divided into number of blocks, which contains multiple pages. When multiple Flash memories are grouped together, additional address bits are added to the most significant bits in the block address. The number of added bits is equal to $Log_2$ of the number of Flash memories in the group. For examples, 1 bit is needed for 2 Flash memories; 2 bits are required for 4 Flash memories, 3 bits are required for 8 Flash memories and so on.

In this embodiment, the memory selector 108 is a de-multiplexer. All the output ports are disabled when EnMem is not active; when EnMem is active, the memory selector 108 selects one of its output ports to connect to the chip enable from the Flash controller (not shown) via its input port with the selector address (SA[2:1]), which is equal to the latched address (LA[2:1]) output from the address latch 106. Each output port is connected to one of the Flash memory dies such that at any time the chip enable is connected to only one of them in the following manner:

SA[2:1]=LA[2:1]=00: Out1=In; Flash memory 1 (110a) is selected.

SA[2:1]=LA[2:1]=01: Out2=In; Flash memory 2 (110b) is selected.

SA[2:1]=LA[2:1]=10: Out3=In; Flash memory 3 (110c) is selected.

SA[2:1]=LA[2:1]=11: Out4=In; Flash memory 4 (110d) is selected.

A typical Flash memory access operation is divided into command phase, address phase and data phase. During command phase, when ID read access operation is decoded, an active ID signal is sent to the address latch 106, which stores an active output EnID to enable the device ID table 104 throughout the ID read access. As always contradictory to EnID, the EnMem is inactive such that none of the flash memory is enabled. For normal access operations, the latched address is generated during address phase as shown in FIG. 4B. In the address phase, the Flash controller sends column address (page address) then row address (block address) through the I/O bus. If the number of address bits exceeding the width of the I/O bus, multiple cycles are needed for column address and row address. During the last row address cycle, the two most significant bits are stored into the address latch 106 as bit LA2 and LA1. The Flash memory die corresponding to the latched address is selected by the memory selector for data access, while the EnID is not active, the ID device table 104 is not enabled.

As only a single chip enable is needed, this technique not only resolves the space constraint and density availability, it further enhances the capacity expansion especially for the Flash controller with limited chip enable signals.

2. Multiple Chips Sharing Single Chip Enable

Similarly, when a Flash controller has a limited number of chip enable signals, it is desirable for multiple Flash memory chips to share single chip enable. Similar to the multiple-die single chip enable technique described above, at least one allocation logic unit is needed on a printed circuit board PCB in addition to the Flash memory chips. The allocation logic unit can be implemented with discrete, programmable or ASIC (Application Specific Integrated Circuit) components. The allocation logic unit selects one of the Flash memory chips at a time to receive the active chip enable from the Flash controller during normal data access; and returns the new device information from its internal device ID table during ID read access FIG. 5 illustrates a printed circuit board 900 in accordance with the present invention. The printed circuit board 900 includes four Flash memory chips 902a–902d sharing a chip enable from the Flash controller 904. The Flash controller 904 may have only two primary chip enables due to the cost and pin count restriction, which supports only two Flash memory chips in the normal case. However, when a one-to-four allocation logic unit 906 is added, the number of Flash memory chips 902a–902d can be expanded to four utilizing 4 secondary chip enable signals. If a second one-to-eight allocation logic unit is added, eight more Flash memory chips can be included to share CE2 on the PCB 900. In this case, a total of twelve Flash memory chips can be utilized with only two primary chip enable signals. The technique is especially useful for capacity expansion when the flash controller has limited number of chip enables.

Accordingly, a system and method in accordance with the present invention allows for a Flash controller with a limited number of chip enable signals to enable an increased number of flash memory dies without increasing the number of pins in a package. Similarly, when multiple flash memory chips are utilized on a printed circuit board and the number of chip enable signals on the Flash controller are limited, system and method in accordance with the present invention allows an increased number of Flash memory chips to be enabled. Through the use of an allocation logic unit with a Flash controller, a single primary chip enable is de-multiplexed into multiple secondary chip enables for multiple Flash memory dies or chips. In so doing, Flash storage device capacity is greatly expanded.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A memory package comprising:
a plurality of memories; and
a logic unit coupled to the plurality of memories for receiving a single chip enable signal and de-multiplexing the single chip enable signal to a plurality of chip enable signals, each of the plurality of chip enable signals for controlling access to one of the plurality of memories wherein the logic unit comprises a command decoder for receiving control signals, the single chip enable signal and an I/O bus signal from a controller; an address latch coupled to the command decoder for receiving the signals from the command decoder and for latching the address from the I/O bus signal; and a memory selector for receiving signals and address from the address latch and for receiving the single chip enable signal and for selecting the appropriate one of the plurality of Flash memories for access in the plurality of chip enable signals.

2. The memory package of claim 1 wherein the plurality of memories comprise Flash memories.

3. The memory package of claim 1 includes a device ID table for receiving signal from the address latch and for providing the device information of the plurality of Flash memories to the controller through the I/O bus signal.

4. The memory package of claim 1 wherein the memory selector selects one of a plurality of output ports to connect the single chip enable signal with one of the plurality of memories to enable access to the one memory.

5. A printed circuit board (PCB) comprising:
a controller for providing at least one primary chip enable signal;
a plurality of memory chips; and at least one logic unit coupled to at least a portion of the plurality of memory chips and the controller, the logic unit for receiving the at least one chip enable signal and de-multiplexing the at least one chip enable signal to a plurality of secondary chip enable signals, each of the plurality of secondary chip enable signals for controlling access to one of the memory chips wherein the at least one logic unit comprises a command decoder for receiving control signals, the single chip enable signal and an I/O bus signal from a controller; an address latch coupled to the command decoder for receiving the signals from the command decoder and for latching the address from the I/O bus signal; and a memory selector for receiving signals and address from the address latch and for receiving the single chip enable signal and for selecting the appropriate one of the plurality of memories for access in the plurality of chip enable signals.

6. The PCB of claim 5 wherein the plurality of the memory chips comprises Flash memory chips.

7. The PCB of claim 5 includes a device ID table for receiving signal from the address latch and for providing the device information of the plurality of Flash memories to the controller through the I/O bus signal.

8. The PCB claim 5 wherein the memory selector selects one of a plurality of output ports to connect the single chip enable signal with one of the plurality of memories to enable access to the one memory.

9. The PCB of claim 5 wherein at least one primary chip enable signal comprises a plurality of primary chip enables, wherein at least one logic unit comprises a plurality of logic units, and wherein each of the plurality of logic units receives one of the plurality of primary chip enable signals.

* * * * *